(12) United States Patent
Baer et al.

(10) Patent No.: US 7,588,884 B2
(45) Date of Patent: Sep. 15, 2009

(54) METHOD FOR ENHANCING WAFER ALIGNMENT MARKS

(75) Inventors: Amanda Baer, Campbell, CA (US); Nian-Xiang Sun, Sunnyvale, CA (US); Sue Siyang Zhang, Saratoga, CA (US); Yi Zheng, San Ramon, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 884 days.

(21) Appl. No.: 10/857,151

(22) Filed: May 28, 2004

(65) Prior Publication Data

US 2005/0266357 A1 Dec. 1, 2005

(51) Int. Cl.
*G03F 1/00* (2006.01)

(52) U.S. Cl. .................. 430/324; 430/322; 430/315; 430/311

(58) Field of Classification Search ............... None
See application file for complete search history.

(56) References Cited

U.S. PATENT DOCUMENTS

| | | | |
|---|---|---|---|
| 6,003,223 A | 12/1999 | Hagen et al. | |
| 6,012,218 A | 1/2000 | Shimizu et al. | |
| 6,076,252 A | 6/2000 | Sasaki | |
| 6,154,346 A | 11/2000 | Sasaki | |
| 6,233,813 B1 | 5/2001 | Sasaki et al. | |
| 6,266,868 B1 | 7/2001 | Sasaki | |
| 6,557,241 B1 | 5/2003 | Sasaki | |
| 6,588,091 B1 | 7/2003 | Chang et al. | |
| 6,671,135 B2 | 12/2003 | Sasaki et al. | |
| 6,979,526 B2 * | 12/2005 | Ning | 430/314 |
| 2005/0174704 A1 * | 8/2005 | Lin et al. | 360/324.12 |

FOREIGN PATENT DOCUMENTS

| | | | |
|---|---|---|---|
| EP | 0326904 B1 | 8/1989 |
| JP | 60059517 A1 | 4/1985 |
| JP | 61057016 A1 | 3/1986 |
| JP | 62262213 A1 | 11/1987 |
| JP | 6338033 A1 | 12/1994 |
| JP | 10133397 A1 | 5/1998 |

* cited by examiner

*Primary Examiner*—John A McPherson
*Assistant Examiner*—Daborah Chacko Davis
(74) *Attorney, Agent, or Firm*—G. Marlin Knight

(57) ABSTRACT

A method of enhancing alignment marks defined in a relatively thin layer on a wafer by etching the alignment marks into an underlying alignment mark transfer layer is described. The target area for the alignment marks is prepared by depositing material for the transfer layer. In alternative embodiments an oversized trench is formed in the target area prior to the deposition of the transfer layer. The alignment marks can fabricated in the layer(s) deposited by the existing process or alternatively, the original layers can be removed and replaced with a layer of material selected to have comparable etching properties (definition layer).

19 Claims, 7 Drawing Sheets

31 TRANSFER LAYER

31 TRANSFER LAYER

METHOD FOR ENHANCING WAFER ALIGNMENT MARKS

FIELD OF THE INVENTION

The invention relates to the field of thin film device fabrication and more particularly to methods, materials and structures used to fabricate alignment marks by which successive layers of photolithographic mask can be aligned; and even more particularly, the invention relates methods, materials and structures used to fabricate alignment marks which by successive layers of photolithographic mask can be aligned during the fabrication of magnetic heads.

BACKGROUND OF THE INVENTION

The read and write head portions of the slider for use in a typical prior art magnetic disk recording system are built-up in layers using thin film processing techniques. Typically the read head is formed first, but the write head can also be fabricated first. The conventional write head is inductive and the read sensor is magnetoresistive. In the typical process of fabricating thin film magnetic transducers, a large number of transducers are formed simultaneously on a wafer. After the basic structures are formed the wafer is cut into rows or individual transducers.

The various photolithography steps involved in the fabrication of a magnetic head require precise alignment with previous structures. The photolithography masks include alignment marks for use in aligning the various patterns on the wafer. The marks may be of various types including arrays parallel lines, boxes or gratings and are located in regions of the wafer that are not being used for the heads. Typically a first mask creates a plurality of alignment marks on the wafer at a first patterning step and subsequent masks contain masks portions which are aligned to the previously formed mask. Standard photolithography equipment such as steppers have the capability of automatically detecting previously formed alignment marks. The amount of mask misalignment is a critical source of error during subsequent operations. As recording density requirements increase, the precision of alignment between the read head and the write head must also increase. Typically the read head is fabricated first. Ideally the masks used to form the write head structures should be critically aligned with the magnetic sensor structure (stripe) in the read head. The magnetic sensor layer which will also be called the K3 layer herein. The magnetic stripe must be thin, e.g. currently around 25 nm, so the alignment marks defined at the K3 layer are shallow and these marks cannot be used for alignment of subsequent layers due to the weak stepper signal generated. Therefore, current practice is to use an independent first layer (Z0 layer) for alignment which is an indirect approach which introduces an additional source of error.

What is needed is method of enhancing the shallow alignment marks created in a relatively thin layer such as the sensor layer so that subsequent layers such as write head layers can align directly to alignment marks created during the fabrication of the relatively thin layer.

SUMMARY OF THE INVENTION

The invention includes a method of enhancing alignment marks defined in a relatively thin layer on a wafer by etching the alignment marks into an underlying alignment mark transfer layer. The invention can be adapted to a variety of alignment mark generation processes without having to modify the existing process. Prior to the photolithographic patterning of the alignment marks, the target area for the alignment marks is prepared by depositing material for the transfer layer and optionally a definition layer. The alignment mark can be defined in the material used for the wafer layer in the existing process or the definition layer can be substituted. After the bed layers have been prepared, the alignment marks can be fabricated through the existing process such as the conventional K3 ion mill process. The filled voids forming the alignment marks are reopened and a RIE process is then used to transfer the shallow marks into thicker transfer layer to form a much deeper stepper alignment marks. The process of fabricating the additional structures on the wafer will fill-in the voids with thick alumina, but the enhanced alignment marks will be optically detectable through the transparent alumina. In an embodiment of the method for fabricating magnetic heads, optionally an oversized trench is formed by ion milling through the sensor and gap films only in the target area prior to the deposition of the transfer and definition layers. The oversized trench provides protection for the bed layers deposited therein from a CMP process during alignment mark fabrication and can be omitted if the bed layers will not be subjected to CMP.

In an alternative embodiment of the invention, the definition layer will be wet etched away after marks are transferred into transfer layer. This acts to sharpen the edges of the alignment marks, since the edges of the definition layer can incur erosion. This is achieved by depositing a thin wet etch stopper layer over the metallic S1 layer prior to the transfer layer. As in the first embodiment, RIE will transfer the definition layer marks into deep transfer layer marks. A wet etch process will follow to remove the metal definition layer so that only transfer layer marks are left. The stopper layer will protect the underlying metallic S1 while the definition layer is being removed.

DETAILED DESCRIPTION OF THE INVENTION AND THE PREFERRED EMBODIMENTS

The method of the invention provides for enhancement of shallow alignment marks. The invention allows the shallow marks to be defined by an existing process and then enhances the marks. In each of the main embodiments of the invention, a layer of material with selected etching properties (the transfer layer) is disposed in the target area for the alignment marks. The steps of the existing process are executed without alteration so that implementation of the invention can be performed with minimum impact on the overall process. Typically the existing process produces marks filled with a material such as alumina that is different from the surrounding material. The method of the invention will be described in detail for use in fabricating magnetic heads; however, the invention can be applied in other environments where the basic conditions for it use exist. The invention does not constrain the details of the read or write head and can be used with a variety of read head and write head designs. Standard thin film techniques are used. An embodiment of the method of the invention with a head design which requires the read head to be formed first will be described.

Figure 1:
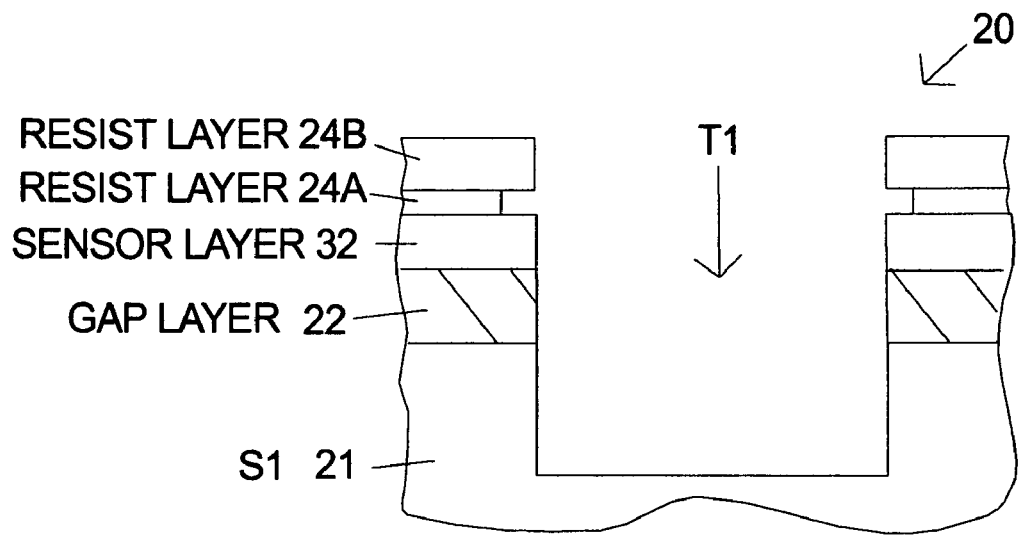
FIG. 1 is an illustration of a section of a wafer taken perpendicular to the surface of the wafer and the plane of the thin films in which a trench has been formed in the target area for the alignment marks according to a first embodiment the invention.

FIG. 1 is an illustration of a section of a wafer 20 on which thin film magnetic heads are being fabricated. The section is taken perpendicular to the surface of the wafer and the plane of the thin films. Typically a large number of heads or other devices are fabricated simultaneously on a wafer and a number of alignment marks will be fabricated in various positions on the wafer. The discussion below illustrates the method of the invention for a single alignment mark, but any number and pattern of alignment marks can be used with the invention. The first shield (S1) 21, the gap layer 22 and the sensor layer 32 have been deposited according to the prior art. The sensor layer 32 is shown as a single layer for convenience; however, typically sensors have a plurality of layers. The details of the substructure of the sensor are outside of the scope of the invention and are according to the prior art. The existing process of fabricating the heads is interrupted at this point to prepare the alignment mark trench.

According to an embodiment of the invention a bi-layer photoresist consisting of resist layers 24A, 24B is patterned to allow alignment mark trench T1 to be etched through the sensor layer 32, the gap layer 22 and preferably partially into S1 21. The alignment mark trench T1 is oversized in relation to the alignment marks to allow for positioning variations and is deeper than the total thickness of the layers which will be deposited in it to protect the bed from the subsequent CMP planarization process which is part of the conventional K3 sensor layer fabrication process. In applications where the alignment mark fabrication process does not include a CMP process the alignment mark trench can be omitted.

Figure 2:
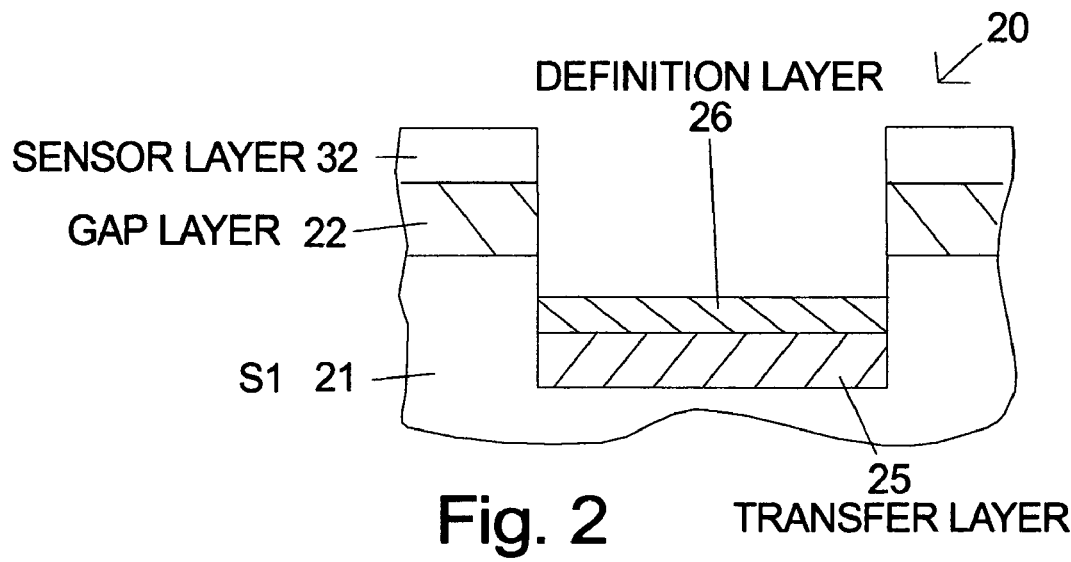
FIG. 2 is an illustration of a section of the wafer of FIG. 1 after deposition of the transfer layer and the definition layer according to a first embodiment the invention.

A bed for the alignment marks is formed in the alignment mark trench T1 by first depositing a transfer layer 25 as shown in FIG. 2. The transfer layer 25 material is deposited to provide a relatively thick underlayer for the alignment marks. In the alternative where the alignment mark trench is omitted the transfer layer will be deposited on the surface of the existing films and will be slightly higher than the rest of the wafer surface. The transfer layer is preferably a transition metal, preferably tantalum, but tungsten and titanium nitride (TiN) can also be used. The transfer layer is preferably substantially thicker than the sensor layer, since the goal is to produce alignment marks that are deeper and more detectable than those produced in the sensor layer. For example, while a typical sensor layer might be 30 nm the transfer layer can be 100 nm. The thickness of the transfer layer can be selected empirically based on the depth needed to produce detectable alignment marks at the subsequent stages of the process. The transfer layer is only needed in the areas where the alignment marks will reside; therefore, the areas of the wafer where the actual head structures exist will be masked. The definition layer 26 is deposited onto the transfer layer 25. The definition layer 26 is formed to provide a substitute layer for the existing process to use for defining the alignment marks in place of the original sensor layer 32. Therefore, the definition layer 26 must be a material which is etched by the process used to etch the sensor layer 32 during the normal process. Since the materials in a typical sensor are metals, any similar metal such as rhodium, NiFe, CoFe, CoFeN, etc. can be used for the definition layer 26, but rhodium is preferred. The thickness of the definition layer 26 should be selected so that unprotected areas of the definition layer will be completely removed by the existing sensor etching process. It is preferable that some etching of the transfer layer 25 occur. After the definition layer 26 has been deposited, the bi-layer resists 24A, 24B are stripped off leaving the definition layer 26 and transfer layer 25 only in the recessed alignment mark trench T1.

Figure 3:
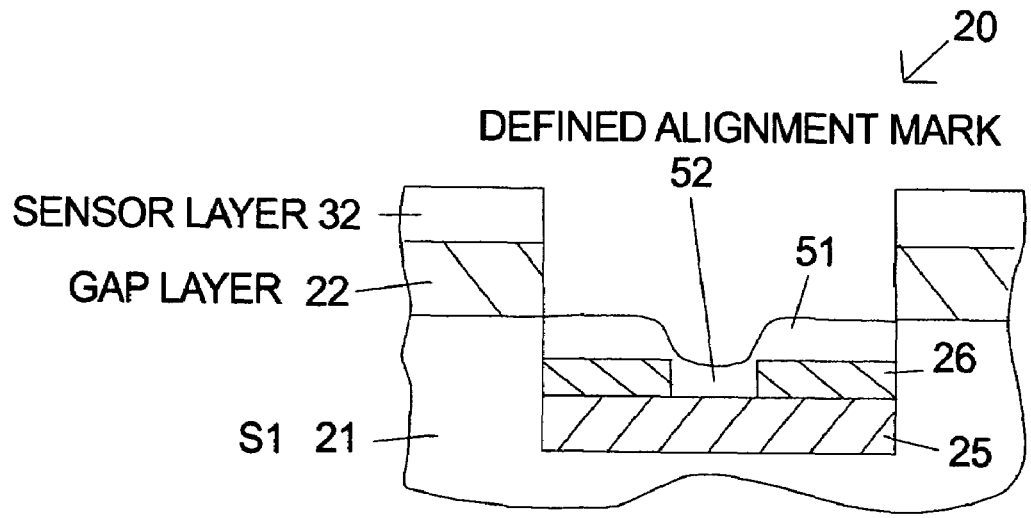
FIG. 3 is an illustration of a section of the wafer of FIG. 2 after the initial alignment marks have been fabricated in the definition layer according to a first embodiment the invention.

After the alignment mark trench T1 has been prepared, the sensor layer structure (K3) patterning process is allowed to resume. The remainder of the conventional K3 process includes deposition of a DLC carbon layer, photolithography patterning steps, ion milling, alumina refilling, as well as, planarization by CMP. FIG. 3 is an illustration of a section of the wafer 20 of FIG. 2 taken perpendicular to the plane of the thin films after completion of K3 process. The K3 process forms a void for the defined alignment mark 52 in the definition layer 26 and then refills with alumina 51. The result is a defined alignment mark 52 filled with alumina in the definition layer 26 in the recessed alignment mark trench or on the surface if no alignment mark trench is used. The defined alignment marks 52 can be formed according to any prior art process and can be any size or shape and can be arrayed in a plurality of locations on the wafer.

The next step in the method is to remove the refilled material in defined alignment mark 52. A mask (not shown) is deposited to protect area of the wafer outside of the alignment mark target area. This mask does not need to be precisely aligned with the alignment marks, since the surrounding material in the definition layer 26 does not need to be protected. For alumina refill a wet etch process is preferred for removal. After removal the surface of the transfer layer 25 below the alignment mark will be exposed. The remaining definition layer 26 will serve as a mask and allow the exposed transfer layer 25 to be selectively etched preferably by RIE.

Figure 4:
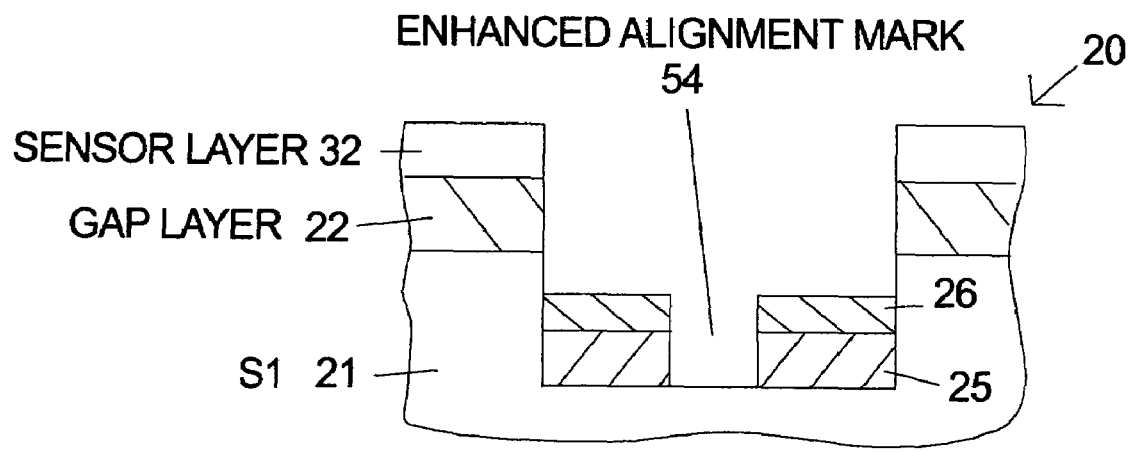
FIG. 4 is an illustration of a section of the wafer of FIG. 3 after a first etching process has removed the filler material from the alignment marks and a second etching process has etched into the transfer layer deepening the alignment marks according to a first embodiment the invention.

When the definition layer 26 is metallic, for example, rhodium, and the transfer layer 25 is a transition metal such as tantalum, selective RIE can be achieved using prior art techniques. It should be noted that the thickness of the layers in the drawings are not indicative of the actual thickness and the transfer layer 25 is preferably several times thicker than the definition layer 26. The RIE process can be continued until the transfer layer 25 under the alignment mark has been completely removed as shown. However, it is also possible to stop the RIE process before breaking through the transfer layer 25. If the transfer layer 25 is made sufficiently thick, then a buffer layer of the transfer layer material will remain over the metallic S1. FIG. 4 is an illustration of a section of the wafer of FIG. 3 taken perpendicular to the plane of the thin films after the RIE process has enhanced the alignment mark by transferring (deepening) it into the transfer layer 25. The enhanced alignment mark 54 is now a void in the definition layer 26 and the definition layer 25. The prior art process for fabricating a magnetic head can be resumed at this point. The alignment mark trench T1 and the enhanced alignment mark voids will be filled by alumina during the standard deposition and planarization process steps, but and the enhanced alignment mark will be optically detectable through the alumina and can be used to align the critical write head structures.

Figure 5:
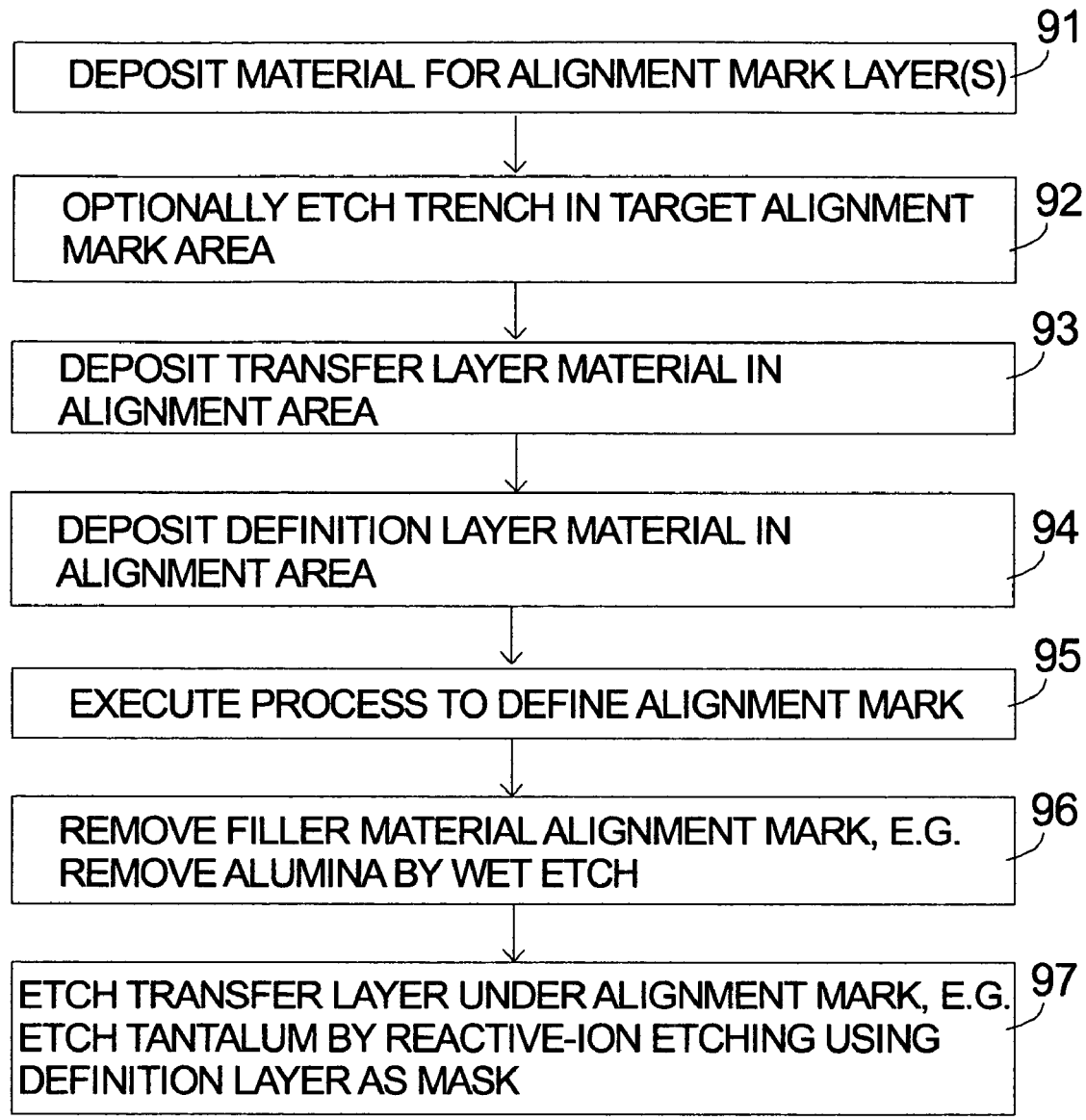
FIG. 5 is a flowchart of steps in a first embodiment of the method of the invention.

FIG. 5 is a flowchart of the embodiment of the method described above. The prior art material for the alignment mark layer(s) is deposited first 91. For magnetic heads this will actually be a stack of layers of primarily metallic materials. The general alignment mark target area is optionally etched to form alignment mark trenches 92 while the rest of the wafer is protected by a mask. The alignment mark trenches should be made relatively deep to accommodate the bed layers for the alignment marks, as well as, any materials deposited by the prior art alignment mark process and still be underfilled. The first layer deposited in the trench is the transfer layer 93. This layer is preferably a transition metal such as tantalum and is relatively thick. The second layer deposited in the trench is the definition layer 94. This layer is selected to have similar etching properties to the original material deposited by the existing process in which the alignment marks were previously defined. For magnetic heads the definition layer is preferably a metal. The deposition of the definition layer completes the bed in the alignment mark trench and the existing process which will define the alignment marks is allowed to complete 95. The filler material such as alumina is then removed from alignment mark in the definition layer, preferably by a wet etch 96. The exposed transfer layer is now etched preferably by RIE to deepen the alignment mark 97. The enhanced alignment marks are now available for use in the remainder of the prior art process which in the case of the magnetic head process will fabricated the write head.

Figure 12:
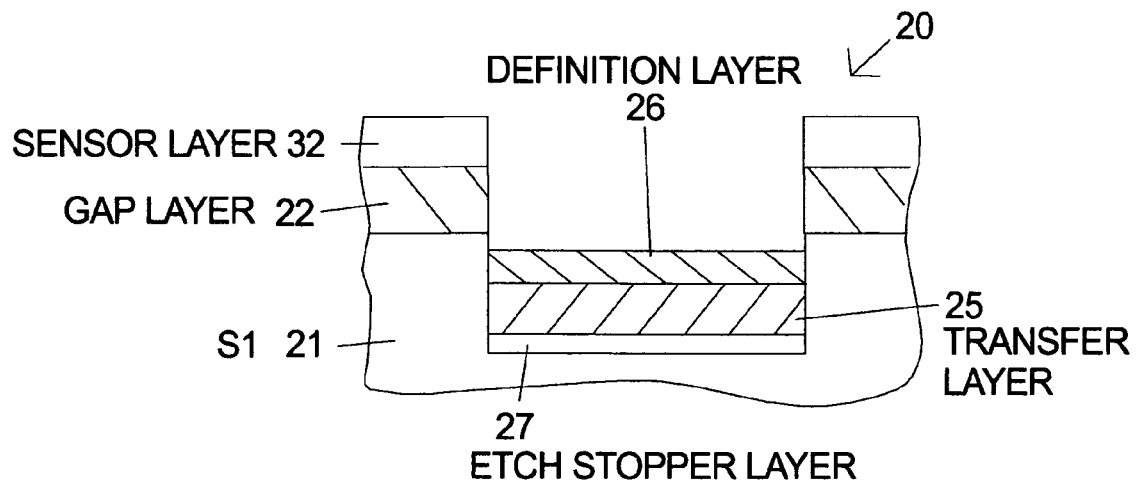
FIG. 12 is an illustration of a section of the wafer of FIG. 1 after deposition of a wet etch stop layer, the transfer layer and the definition layer according to an alternative embodiment the invention.
Figure 13:
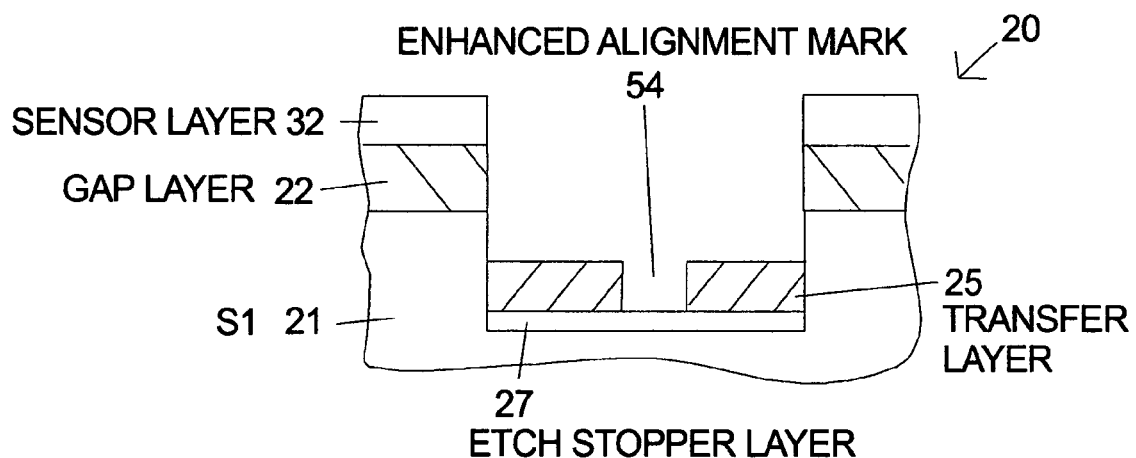
FIG. 13 is an illustration of a section of the wafer of FIG. 12 after the alignment mark has been enhanced and the definition layer has been removed according to an alternative embodiment the invention.

In the method described above the upper edges of the enhanced alignment mark are formed by the definition layer which can be eroded during processing. A sharper edge for the alignment marks can be obtained by removing the definition layer, for example, by a wet etch, leaving only the transfer layer. If the RIE process has left a portion of the transfer layer at the bottom of the alignment mark, the wet etch removal of the definition layer can be added to the method described above. However, if the RIE process has removed all of the transfer layer under the alignment mark, then the surface of S1 will be exposed. Since the definition layer and the shield S1 are similar metals, S1 can require protection when a wet etch is used to remove the definition, layer. An alternative of the foregoing embodiment includes the use of an etch stopper film under the transfer layer. As shown in FIG. 12 a wet etch stopper layer 27 can be deposited over the exposed surface of S1. The method then continues as described above through the completion of the RIE to transfer the alignment mark through the transfer layer 25. The definition layer 26 can then be removed by a wet etch suitable to remove metal. The result is shown in FIG. 13 where the enhanced alignment mark 54 is defined in the remaining transfer layer. Note again that the illustrations do not show the actual thickness of the layers, so the transfer layer 25 is much thicker relatively than shown so the removal of the relatively thin definition layer does not necessarily reduce the effectiveness of the alignment mark.

Figure 6:
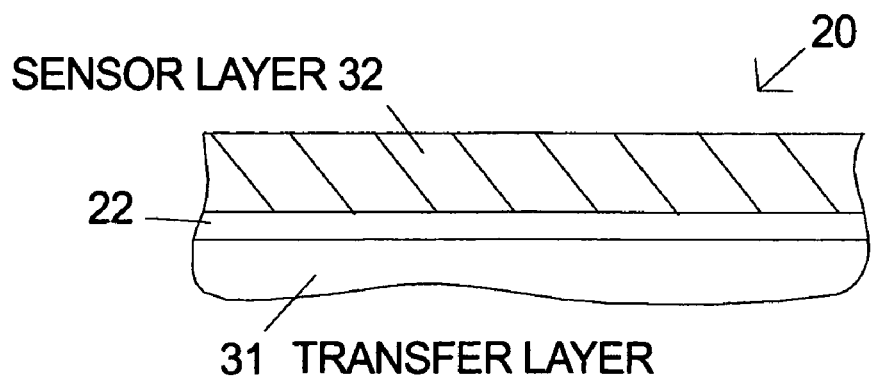
FIG. 6 is an illustration of a section of a wafer after deposition of the transfer layer in the target alignment area followed by the layers associated with the alignment mark formation process according to a second embodiment of the invention.
Figure 7:
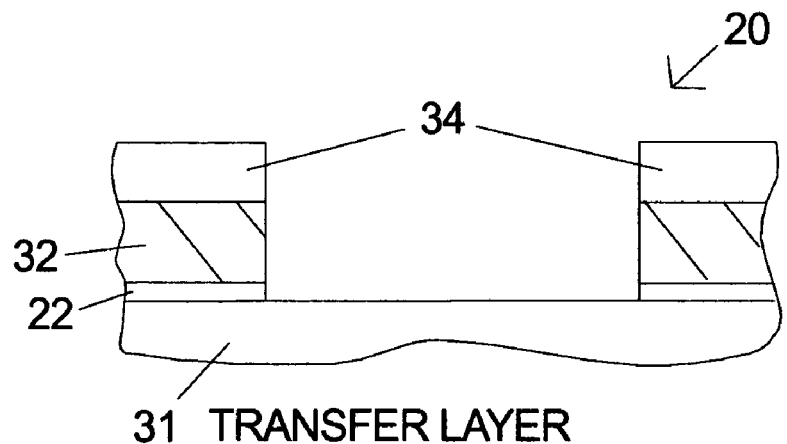
FIG. 7 is an illustration of a section of the wafer of FIG. 6 after fabrication of the alignment mark trench according to a second embodiment of the invention.
Figure 8:
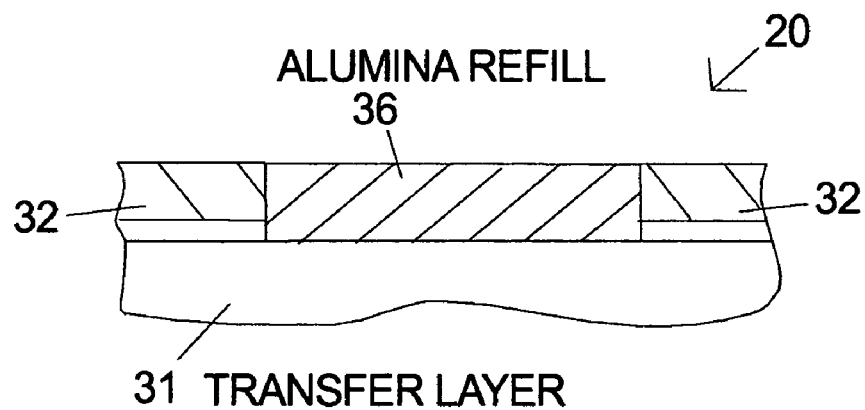
FIG. 8 is an illustration of a section of the wafer of FIG. 7 after the alignment mark trench has been refilled and the wafer planarized according to a second embodiment of the invention.
Figure 9:
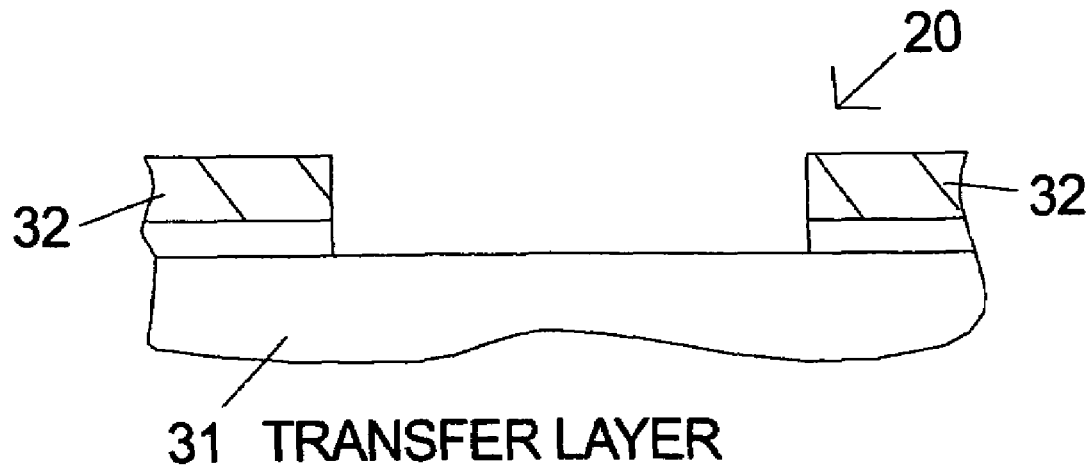
FIG. 9 is an illustration of a section of the wafer of FIG. 7 after the refilled material has been removed from the alignment mark trench by a first etching process according to a second embodiment of the invention.
Figure 10:
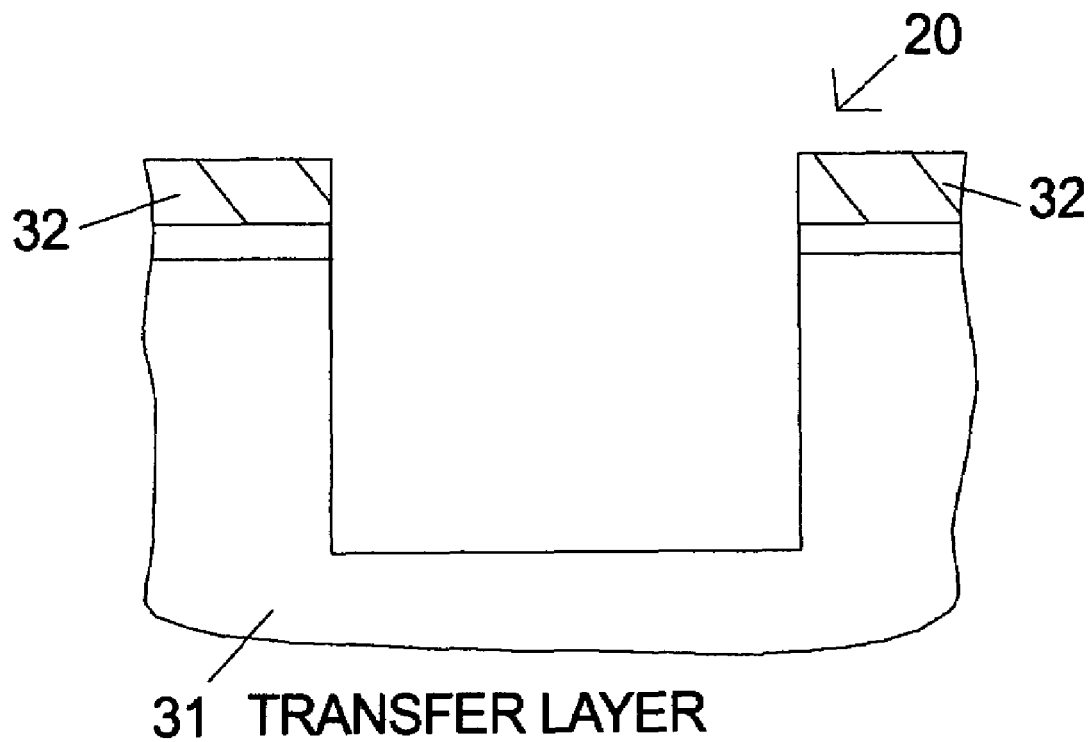
FIG. 10 is an illustration of a section of the wafer of FIG. 8 after the alignment mark trench has been deepened by removing material from the transfer layer by a second etching process according to a second embodiment of the invention.
Figure 11:
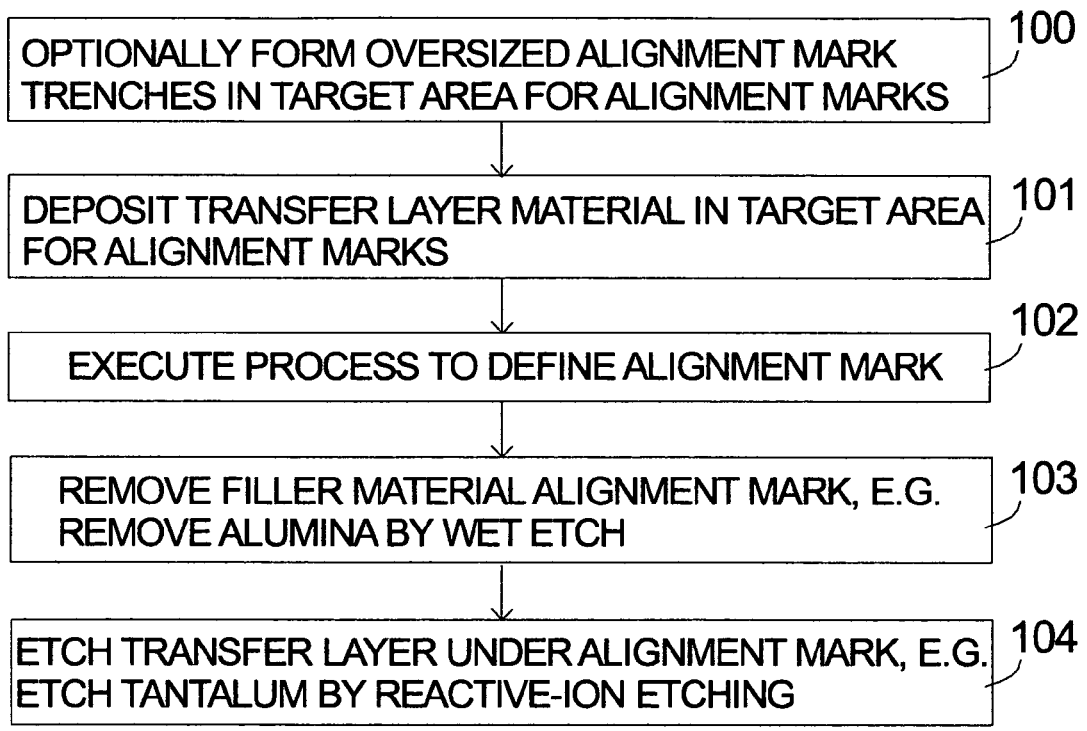
FIG. 11 is a flowchart of steps in a second embodiment of the method of the invention.

An alternative embodiment of the method of the invention will now be described. In this embodiment as illustrated in FIG. 6, the transfer layer 31 is deposited prior to the deposition of the material used in the existing process for defining the alignment marks which for the magnetic head embodiment is the sensor layer(s) 32 and gap layer 22. The transfer layer is preferably tantalum, tungsten or TiN and is selected to provide selective etching in contrast to the metallic films in the sensor layer(s) 32. The transfer layer 31 is preferably substantially thicker than the sensor layer(s) 32. For example, while a typical sensor layer might be 30 nm the transfer layer can be 100 nm. The thickness of the transfer layer can be selected empirically based on the depth needed to produce detectable alignment marks at the subsequent stages of the process. The transfer layer 31 is only used in the target areas for the alignment marks so the remainder of the wafer is masked when the transfer layer 31 material is deposited. The mask is then stripped leaving the transfer layer 31 patterned in the alignment areas. Alternatively, an alignment mark trench as described above can be formed prior to the deposition of the transfer layer 31. The standard K3 process of creating alignment marks in the sensor layer structure is then executed as described above. The K3 process will deposit and pattern mask 34 in order to etch the void for the alignment marks as shown in FIG. 7. The voids are then refilled with alumina to form the alignment marks 36 in the sensor layer and gap layer as shown in FIG. 8. In the method of the invention the alumina is then preferably removed by wet etching to reopen the trench and expose the underlying transfer layer 31 as shown in FIG. 9. As in the first embodiment the alignment marks are then preferably deepened (transferred) into the transfer layer 31 by a process such as reactive-ion-etching (RIE). The result is deeper alignment marks in the form of voids as shown in FIG. 10. The resumption of the standard process completing the read head and beginning the write head will result in the deepened alignment marks being refilled with alumina. The deeper marks will have enhanced optical detectability when the critical write head structures are formed allowing greater alignment precision. FIG. 11 is a flowchart of the second embodiment of the invention. Optionally the alignment mark trenches can be formed as the first step in this embodiment 100. The transfer layer is deposited in the target area for the alignment marks 101. The existing process is executed to define the alignment marks 102. The filler material such as alumina is then removed from alignment mark preferably by a wet etch 103. The exposed transfer layer is now etched preferably by RIE to deepen the alignment mark 104. The enhanced alignment marks in the form of voids are now available for use in the remainder of the prior art process which in the case of the magnetic head process will fabricate the write head.

Although the embodiments of the invention have been described in particular embodiments those skilled in the art will recognize that the invention may be used in other embodiments where alignment marks need to be enhanced.

The invention claimed is:

1. A method of fabricating thin films on a wafer comprising the steps of:
   depositing a first layer on the wafer which includes an alignment mark area;
   depositing a transfer layer on the alignment mark area;
   depositing a definition layer onto the transfer layer in the alignment mark area;
   fabricating an alignment mark filled with a filler material above the transfer layer, fabricating the alignment mark further comprising forming a void in the definition layer for the alignment mark and filling the void with a filler material;
   removing the filler material from the alignment mark exposing an underlying surface of the transfer layer; and
   deepening the alignment mark by removing material from the underlying surface of the transfer layer.

2. The method of claim 1 further comprising forming an alignment mark trench in the alignment mark area prior to depositing transfer layer, the alignment mark trench being oversized in comparison to a predetermined size of the alignment mark.

3. The method of claim 2 wherein the step of fabricating the alignment mark further comprises planarizing the wafer.

4. The method of claim 1 further comprising depositing an etch stopper film in the alignment mark area prior to depositing the transfer layer and removing material from the definition layer after deepening the alignment mark.

5. The method of claim 1 wherein the step of deepening the alignment mark by removing material from the underlying surface of the transfer layer further comprises exposing a surface of the first layer under the transfer layer.

6. The method of claim 1 wherein the transfer layer is transition metal.

7. The method of claim 1 wherein the transfer layer is transition metal and the definition layer is a metal.

8. The method of claim 1 wherein the transfer layer is tantalum.

9. A method of fabricating thin films on a wafer comprising the steps of:
   depositing a transfer layer in an alignment mark area;
   depositing a definition layer onto the transfer layer in the alignment mark area;
   fabricating an alignment mark filled with a filler material in the definition layer;
   removing the filler material from the alignment mark exposing an underlying surface of the transfer layer; and
   deepening the alignment mark by removing material from the underlying surface of the transfer layer.

10. The method of claim 9 further comprising depositing one or more layers for a sensor for a magnetic head prior to the step of depositing a transfer layer.

11. The method of claim 9 further comprising forming an alignment mark trench in the alignment mark area prior to depositing the transfer layer and wherein the alignment mark trench is larger in size than a predetermined size of the alignment mark to allow for positioning errors in the step of fabricating the alignment mark.

12. The method of claim 9 wherein the definition layer is a metal and the transfer layer is a transition metal.

13. The method of claim 9 wherein the definition layer is rhodium and the transfer layer is tantalum.

14. A method of fabricating thin films on a wafer comprising the steps of:
   depositing one or more films as a part of a process of fabricating a selected layer on the wafer;
   forming an alignment mark trench in an alignment mark area of the wafer including removing the one or more films deposited as a part of a process of fabricating a selected layer on the wafer;
   depositing a transfer layer in the alignment mark trench;
   depositing a definition layer onto the transfer layer in the alignment mark trench;
   fabricating an alignment mark filled with a filler material in the definition layer;
   removing the filler material from the alignment mark exposing an underlying surface of the transfer layer; and
   deepening the alignment mark by removing material from the underlying surface of the transfer layer.

15. The method of claim 14 wherein the selected layer on the wafer is for a sensor for a magnetic head.

16. The method of claim 15 wherein the step of forming an alignment mark trench removes a sensor layer and a gap layer and a portion of a shield for the magnetic head.

17. The method of claim 14 wherein the definition layer is a metal and the transfer layer is a transition metal.

18. The method of claim 14 wherein the definition layer is rhodium and the transfer layer is tantalum.

19. The method of claim 14 wherein the step of fabricating the alignment mark includes planarizing the wafer.

* * * * *